US012700829B2

(12) United States Patent
Ganton et al.

(10) Patent No.: US 12,700,829 B2
(45) Date of Patent: Aug. 4, 2026

(54) SYSTEM AND APPARATUS FOR GENERATING DYNAMIC REFERENCE VOLTAGE IN POWER CONSTRAINED DEVICES

(71) Applicants: Robert Bruce Ganton, San Diego, CA (US); Robert S Ballam, Eaton Hill (CA)

(72) Inventors: Robert Bruce Ganton, San Diego, CA (US); Robert S Ballam, Eaton Hill (CA)

( * ) Notice: Subject to any disclaimer, the term of this patent is extended or adjusted under 35 U.S.C. 154(b) by 468 days.

(21) Appl. No.: 17/187,797

(22) Filed: Feb. 27, 2021

(65) Prior Publication Data

US 2022/0014149 A1 Jan. 13, 2022

Related U.S. Application Data

(60) Provisional application No. 62/982,510, filed on Feb. 27, 2020.

(51) Int. Cl.
| | |
|---|---|
| *H03F 3/70* | (2006.01) |
| *H03F 1/02* | (2006.01) |
| *H03F 3/45* | (2006.01) |
| *H03M 1/12* | (2006.01) |
| *G01N 27/02* | (2006.01) |

(52) U.S. Cl.
CPC ........... *H03F 1/02* (2013.01); *H03F 3/45475* (2013.01); *H03M 1/1245* (2013.01); *G01N 27/028* (2013.01)

(58) Field of Classification Search
CPC ........................................................ H03F 3/70
See application file for complete search history.

(56) References Cited

U.S. PATENT DOCUMENTS

| | | | | |
|---|---|---|---|---|
| 9,250,299 | B1 * | 2/2016 | Yarlagadda | ............. G01D 21/02 |
| 10,224,812 | B1 * | 3/2019 | Sen | ........................ H02M 3/157 |
| 2016/0291631 | A1 * | 10/2016 | Sen | .......................... G05F 3/262 |
| 2021/0255650 | A1 * | 8/2021 | Tschirhart | ................. H02J 1/14 |
| 2021/0327239 | A1 * | 10/2021 | Falkenburg | ............. H02M 1/00 |
| 2022/0300608 | A1 * | 9/2022 | Srivastava | ............ G06F 21/554 |
| 2022/0416743 | A1 * | 12/2022 | Modaffari | ................. H03F 3/70 |
| 2023/0108028 | A1 * | 4/2023 | Grant | ................... G01N 33/497 |
| | | | | 73/23.3 |

* cited by examiner

*Primary Examiner* — Patricia T Nguyen

(57) ABSTRACT

A simplified electronics approach to allow cost, size, and power consumption to be reduced while maintaining state of the art accuracy and reliability, key features for wireless medical devices/systems and industrial sensors alike. Extreme accuracy is achieved by innovative noise shaping and filtering introduced to the electrochemical sensor, before sampling by the analog to digital converter. Introduction of the noise and bias to the electrochemical sensor provides very low power biasing which is necessary to achieve overall reliable and very accurate bias for the electrochemical reaction cell.

19 Claims, 11 Drawing Sheets

300

305
Calculate time to charge the capacitor 290

307
Turn on GPIO 280 and charge the RC network

311
Disconnect GPIO 280 from RC network

314
Read ADC (250)

316
Compare ADC reading to target V

317
If high, discharge capacitor 290

321
If low, charge capacitor 290

331
Wait

328
Sample output 211 with ADC 260

301
EXAMPLE

Target reference V (271) = 0.55V

Battery voltage = 3V

GPIO = 16MHz (62n ns accuracy)

RC time constant = 10ms

400

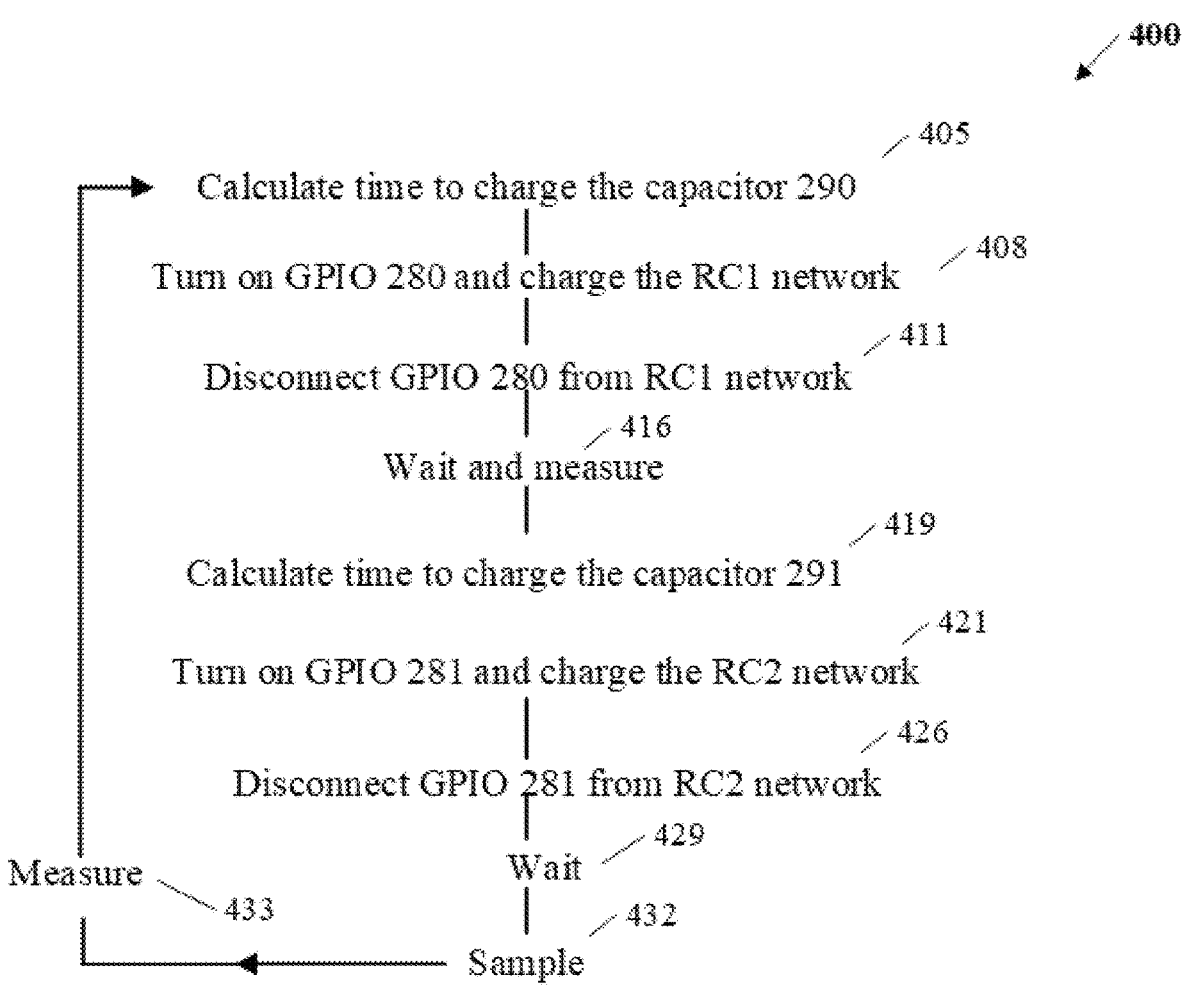

405

Calculate time to charge the capacitor 290

408

Turn on GPIO 280 and charge the RC1 network

411

Disconnect GPIO 280 from RC1 network

416

Wait and measure

419

Calculate time to charge the capacitor 291

421

Turn on GPIO 281 and charge the RC2 network

426

Disconnect GPIO 281 from RC2 network

429

Wait

Measure

433

432

Sample

EXAMPLE

401

Target reference V (271) = 0.55V

Battery voltage = 3V

GPIO = 16MHz (62n ns accuracy)

RC 1 time constant = 10ms

RC 2 time constant = 10s

FIG. 4

Ideal Value is 221.74
Normal Sampled Value is 222
Signal + Noise + Ramp-Noise is 221.76

600

605

Charge the RC network(s) to generate a voltage higher than the desired reference voltage on the reference voltage line

608

Take multiple samples in a sample period as the voltage on the reference voltage line drifts to below the desired reference voltage quasi-symmetrically

611

Average sampled readings in each sample period

614

Return result to the results database

SYSTEM AND APPARATUS FOR GENERATING DYNAMIC REFERENCE VOLTAGE IN POWER CONSTRAINED DEVICES

RELATED APPLICATIONS

This application claims priority to U.S. provisional patent application No. 62/982,510, filed Feb. 27, 2020, and entitled "System and Apparatus for Generating Dynamic Reference Voltage in Power Constrained Devices," which is incorporated herein in its entirety.

FIELD OF THE INVENTION

The field of the present inventions is electronic circuitry for providing a high quality voltage reference signal, for example, to an operational amplifier. Embodiments of the present invention were designed for use in low-power battery powered devices More particularly, a new electronic circuitry is provided that is capable to reduce power consumption while maintaining high accuracy for data collected from an electronic or electrochemical sensor. Applications for this invention, for example, would be medical devices, gas detectors, radiation and photodetector-based smoke detectors, gas/oil mining and refining/exploration industries, or research facilities involving volcanic and tectonic areas. Any device that needs to be low cost and low power in an industry that requires use of sensors to measure current using a measurement technique from the potentiostatic family of measurement techniques to collect data with a high accuracy could benefit from the new circuit.

BACKGROUND

Potentiostatic measurement techniques have been in existence for some time, however the use of these sensors has been somewhat limited by the high cost of the sensor electronics. In order to achieve high accuracy of the measurements produced by the sensors, it is customary for the electronics design of the sensor to use high accuracy references which provide a stable measurement and bias source for driving the sensor's function. The design typically incorporates a highly accurate analog to digital converter (ADC). Additionally, some sensors have Application Specific Integrated Circuits (ASIC) with specialized circuits that include references, and an embedded Digital Signal Processor (DSP) in an attempt to produce a circuit design with highly accurate measurements. The data from the electrochemical reaction are produced under the presence of a bias voltage generated by the ASIC and DSP. The resulting data is a current that is at a rate proportional, or nearly proportional, to the parameter being sensed in the sampled liquid, gas, or tissue. The exact transform is dependent on the construction of the sensor elements performing the electrochemical reaction.

Traditional methods of making the circuit to measure the sensor parameters are costly and consume both space and battery capacity. The demands of sensor markets in general are trending toward lower cost devices, with high accuracy requirements. Lower cost can be achieved by lowering the cost of components used in the circuit as well as by reducing the average current consumption of the device in operation such that the battery or power source can be reduced in both size and cost. For example, in medical device applications, the sterile nature of the design motivates that the device be disposable. Having a disposable medical device with low power consumption allows for the use of a low cost coin cell or printed battery, further improving the cost metrics of the design.

SUMMARY

Various embodiments of the new circuit provide an electrochemical sensor with a high quality and inexpensive reference bias voltage for the sensor to analyze data collected from various elements, such as environmental factors or biological factors. This new circuitry is constructed from inexpensive, readily available, and easy to assemble components, thereby eliminating the need for an expensive high performance voltage reference components. By eliminating the costly discrete references and/or Application Specific Integrated Circuits (ASIC) and/or Digital Signal Processor (DSP) components, and providing the sensor with a reference bias voltage generated from within the circuit itself, the newly designed embodiments provide a low cost, low power solution to potentiostatic measurement systems previously unavailable.

Generally, the new circuit generates a driving signal that can be considered analogous to noise, for example by using one or more pulse generators and a resistor/capacitor network. The driving noise produced from within the circuit itself is generated from a resistor/capacitor network (RC), as well as an additional analog to digital converter, designed into the circuit to provide a bias voltage reference to the sensor. By shaping and filtering the noise to desirable levels to meet industry standards for the sensor and applicable conditions, highly accurate data measurements by the sensor are maintained, while reducing power consumption. The RC networks that produce the reference voltage are regulated through a software platform to control the on/off states of parts of the circuit to further reduce power consumption.

BRIEF DESCRIPTION OF THE DRAWINGS

The accompanying drawings serve to aid the detailed description (with the exception of FIG. 1 which is prior art) of the invention given below and are provided solely for the illustration of the embodiment and not limitation thereof.

FIG. 4 is a flowchart of a process for controlling the new circuit design to generate a reference voltage using a two RC networks as shown in FIG. 2B.

DETAILED DESCRIPTION

Figure 1:
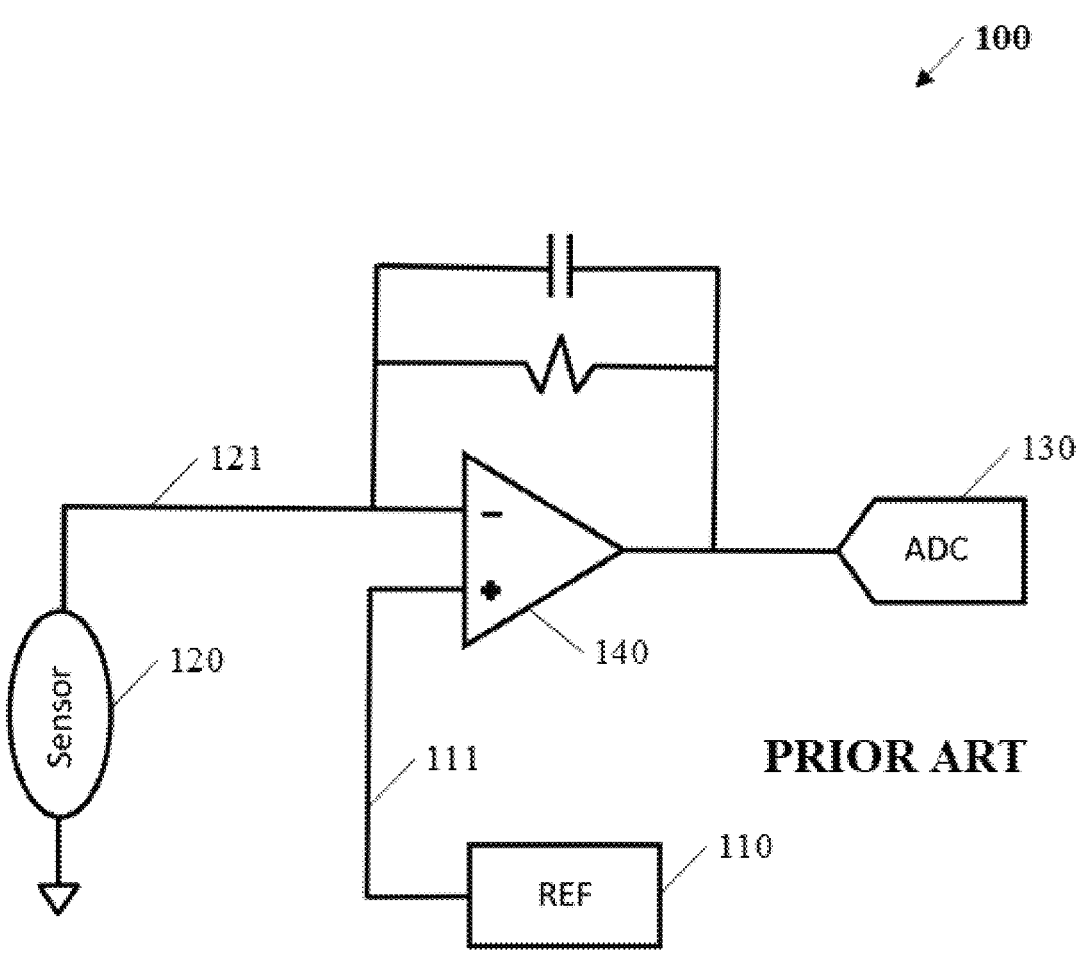
FIG. 1 illustrates a traditional prior art circuit with bias voltage provided by a discrete high-performance reference component.

The various embodiments will be described with respect to the accompanying drawings. The ensuing description provides embodiment(s) only, and is not intended to limit the scope, applicability or configuration of the disclosure or the claims.

The term "sensor" is used herein to refer to a device that detects or measures a physical property of a substance and generates signals, or otherwise responds to the physical property. The sensor may be any electrochemical sensor such as, and not limited to, those used to measure tissue samples containing glucose, and/or other analytes or substances, and refer the analyzed content of the tissue samples to a resulting current flow. The signals generated by the sensor may be analyzed by a microcontroller to measure the one or more detectable substances based on a correlation between the signal and the underlying quantity of the substances. Some detectable substances may be biological factors, such as glucose in sampled live human tissue, or for certain atmospheric factors, such as toxic gases in sampled atmospheres surrounding volcanoes or mining sites, etc.

The term "logic system" is used herein to refer to a system of digital logic circuitry designed to perform a function to control the generation of custom tailored pulses of signal in order to enable direct charging of the capacitor to be accomplished with minimal microprocessor involvement.

The term "software platform/algorithm" is the combination of the embedded software and measurement algorithms such that the software platform/algorithm can implement measurement methods with the accompanying digital system.

The term "current source/sink" refers to a circuit which can, when enabled, produce a specific current in either the positive direction (source), or negative direction (sink). This circuit can be beneficial when driving sensor or circuit elements for a particular purpose. In the case of charging a capacitor, the fact that the I=CdV/dt allows a constant current source to charge a capacitor with a constant voltage change per unit time allowing the circuit to set a specific voltage in a specific time. In the case of using a current sink, the capacitor could be discharged in a similar manner.

The terms "processor or microcontroller" are used herein to refer to any one or all of a general purpose processor, conventional processor, controller, FPGA, state machine, or combinations. The embodiment may be a microprocessor comprised within a System on a Chip (SoC), connected internally to peripherals such as timers, output capture/compare blocks, Analog to Digital Converters (ADCs), embedded memory, and interrupt controllers.

The term "drive noise" is, unless otherwise stated, used herein to refer to electrical signals produced within the circuit a by resistor/capacitor network and presented to the SoC via an operational amplifier (OPAMP), which may be in the SoC. Although noise is traditionally considered undesirable in an electrical circuit, the various embodiments utilize the inventive drive noise for a beneficial effect for improving accuracy of the data collected by the sensor and reducing overall power consumption of the circuit.

FIG. 1 illustrates a typical prior art circuit design 100 using an outside discrete/dedicated reference voltage generating component 110, providing a reference bias voltage 111 for the op amp 140. Component 110 is an expensive high precision component, which the inventive new circuitry, discussed with reference to FIG. 2A and FIG. 2B, advantageously eliminates. A sensor input signal 121 is provided from the sensor 120, which is one input to op amp 140, while the reference bias voltage 111 is the other input to op amp 140. FIG. 1 is considered a typical design and is well known in the art.

Figure 2A:
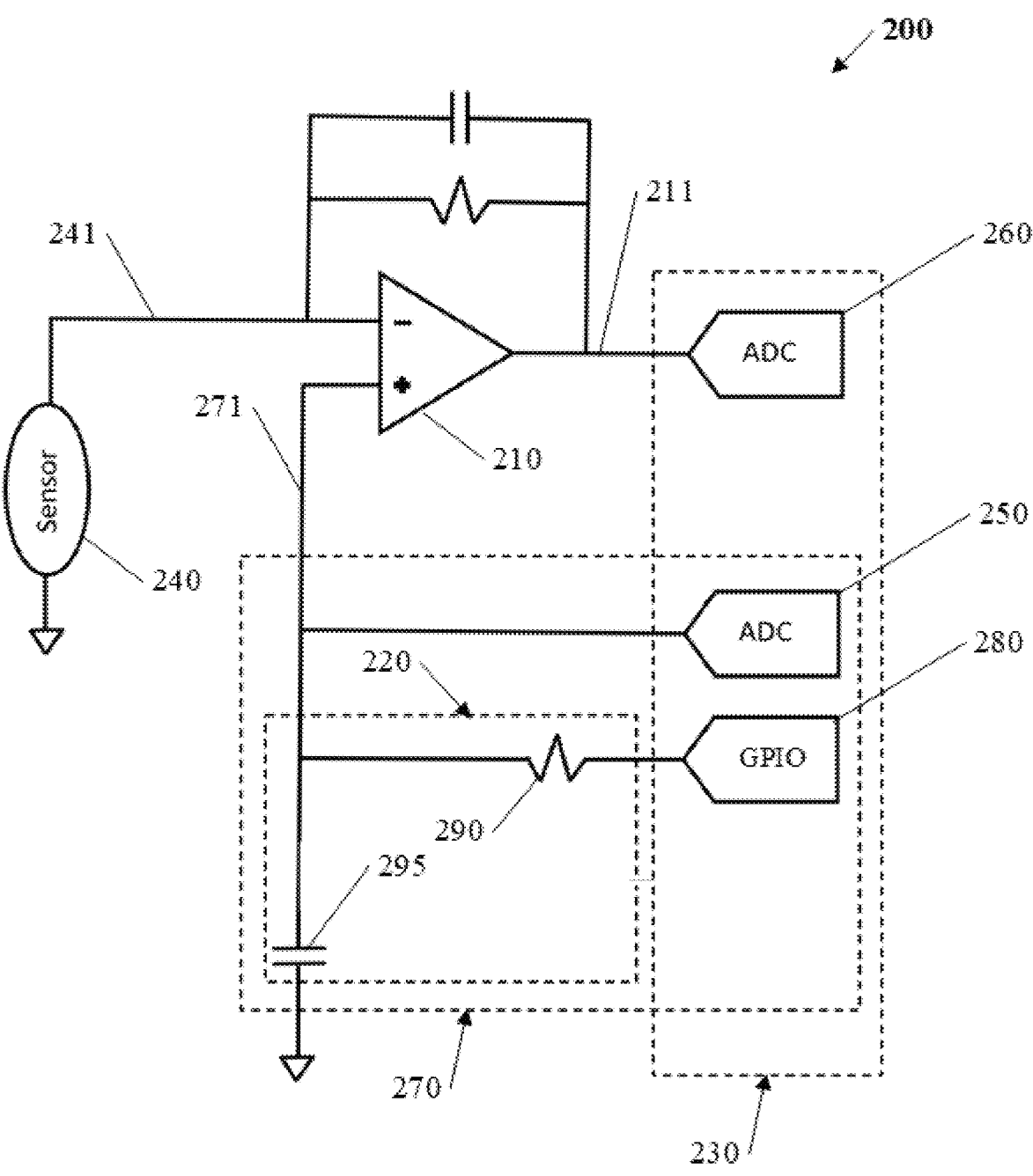
FIG. 2A illustrates an embodiment of the new circuit design with one resistor capacitor network and an additional analog to digital converter, which together generate the reference voltage and drive noise signal required for the analogue to digital signal sampling.

FIG. 2A illustrates a sensor circuit 200 incorporating an embodiment of the inventive new circuit. Generally, subsystem 270 replaces the expensive outside reference component 110 of FIG. 1. It will be understood that components of the subsystem 270 may be in the SoC 230. Sensor 240 is similar to known sensor 120, op amp 210 is similar to known op amp 140, and ADC 260 is similar to known ADC 130. Accordingly, these components will not be discussed in detail. Generally, sensor circuit 200 has an SoC 230 that has several electronic components, as well as a processor. It will be understood that some components illustrated as being in the SoC 230 may be provided as discrete components, and some components illustrated as discrete components may be provide within the SoC 230, as is well understood in the art.

Generally, the sensor 240, such as a CGM, provides an input signal 241 to one input (−) of op amp 210. The input signal 241, for example, may provide a current signal that is indicative of the level of glucose detected by sensor 240. A noise drive signal 271 is provided from subsystem 270, which eliminates the need for any expensive high precision voltage reference component. The noise drive signal 271 is received as the second input (+) to the op amp 210. The op amp 210 outputs a signal 211, which is received by an ADC 260 in the SoC 230.

The sub-system 270 of FIG. 2A provides the reference bias signal as a voltage or current and using the SoC 230 can apply signal processing mathematics to produce a highly accurate signal, with minimal cost and power draw. The SoC has General Purpose Input/Output (GPIO) generator 280. The GPIO generator 280 is controlled by the processor in the SoC 230, and can provide a pulse output waveform with a defined voltage and duty cycle. Such a GPIO generator is highly accurate, inexpensive, easy to program, and can be readily integrated into an SoC. Although it is possible to use an external pulse generator, the SoC 230 integral GPIO 280 is a particularly efficient and cost effective embodiment.

The GPIO sub-system shown as 280 can be configured to deliver a voltage of either logic level high typically at the positive power supply voltage, logic level low at the ground negative power supply voltage, or be configured to be a current source or sink. Additionally, it is possible for the GPIO 280 to be configured to be as an open circuit typically via an open drain connection. In the case where the pin of GPIO 280 is configured as a current source or sink, it is understood that the resistor shown as 290 could be omitted. The disclosed embodiment shown in FIG. 2A can be viewed as three parts working together: bias voltage generation on the sensor without use of a reference voltage; current measurement to digital conversion; and low power modes in the SoC 230 to achieve overall low power consumption of the device.

Although bias voltage generation is traditionally considered constant, in the present embodiment it can be both flexible and constant meaning that it can hold the bias constant or vary the bias due to environmental effects or in the case of medical sensors, as a result of biological and/or physiological effects with the net effect producing a high quality bias voltage and a lower power profile. Although power consumption is a complex field, it is generally considered that the longer a circuit consumes current, the higher the average current consumption. Also, the more current a device, or its subsystem, consumes, the higher the average current consumption. Since energy used is proportional to current consumption multiplied by voltage of system, or subsystem, multiplied by time in operation, the current embodiment with an RC network 220 produces an overall energy consumption rate that is lower than other methods typically used in this type of potentiostatic measurements.

Figure 7:
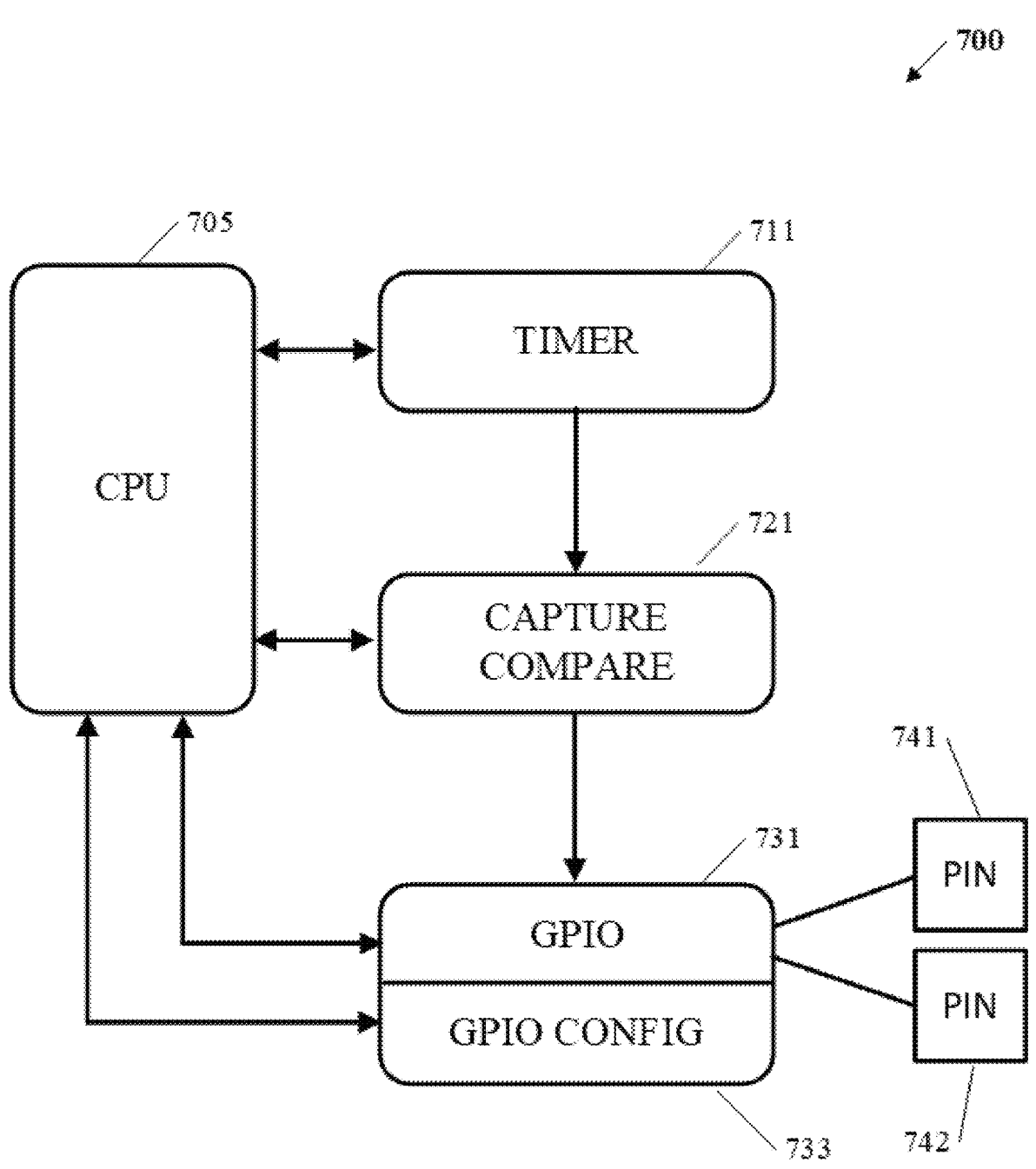
FIG. 7 illustrates a component block diagram of the SoC including the timer and General Purpose Input/output (GPIO).

The disclosed embodiment uses direct charging of a capacitor to allow further simplification, cost reduction, and power reduction. In direct capacitor charging, the voltage on the capacitor that is coupled to the positive terminal of the op amp 210, is measured and the length of time a high output value, which in the current embodiment would be a battery voltage but could be any fixed or variable voltage source to which a connection to the capacitor can be connected and effectively disconnected to reduce leakage and therefore the time of voltage connection can be computed. The system 230 then configures the pin 280 connected to the capacitor to be activated and driven for a very precise, typically approximately 0.002% accuracy, and controlled time via a digital hardware subsystem such as a timer, coupled to an capture compare function coupled to a GPIO sub-system, as seen in FIG. 7. The current embodiment uses a 16 MHz clock to produce roughly 62 ns accuracy and calculates the exact time necessary to load the capacitor with the correct charge to attain the reference voltage. By configuring the digital system of 230 to output a high voltage value to the capacitor via 290, and at the end of the time necessary for charging the capacitor, configuring the pin 280 on the resistor 290 to a high impedance state, commonly called tri-stating, or configuring the pin to have an input state, the exact correct charge is delivered to the capacitor, according to the formula I=CdV/dt.

Optionally, and/or periodically, the capacitor voltage could then be measured to determine that it is at the correct voltage before configuring the system of 230 to make a measurement of the sensor reading. If the voltage on the capacitor is determined to be out of tolerance, the voltage could be adjusted before a measurement cycle is executed by the software running on the SoC 230. In order to further improve the quantization noise effects from the ADC 250 and 260, the capacitor could be charged to a slightly higher value than the initial calculated value of the target bias voltage, and slowly discharged during the measurement cycle at a constant or nearly constant rate allowing the sampling to be able to reduce the noise associated with quantization. More particularly, the capacitor through self leakage or external circuit leakage will either lose charge or gain charge at a relatively constant rate when viewed in a short time period relative to the overall time constant of the capacitor and its parasitic impedance. Charging a discharging capacitor to a slightly higher voltage and letting the discharging function sweep the output voltage through a range will add a noise element to the system which will help mitigate quantisation noise For the method disclosed, the voltage will vary over time which can aid the current measurement to digital conversion discussed below. The varying voltage over time achieves two key goals. The system 270 can achieve very fast stabilization of the measurement and bias generation circuitry through the use of a low time constant RC network 220. This low time constant network allows the output of the chosen pin 280 to have a predictable adjustment time at the positive input of the OPAMP 210.

Using direct capacitor charging, the resistor 290 in the RC network 220 is set to a value which will allow each time tick or clock cycle on the counter to represent approximately 1 Least Significant Bit (LSB) of ADC 250 resolution in the disclosed embodiment. Other embodiments could choose a resistor to be set to represent 0.1 LSB, or other ratios of the LSB, of the ADC 250, however that would result in a higher time value, and therefore slightly less than optimal power consumption profile, or in the case of a lower time, the results would be less accuracy in the measurement of the sensor. In the case of a reference voltage which is outside the voltage limits, the microcontroller in the SoC 230 is configured to provide a current limited charging source, or discharging sink, or a voltage source to the capacitor for a very controlled period of time with a resolution on the order of 62 ns. This would allow the capacitor to be charged to the optimal voltage in the minimum amount of time. In effect, this allows the system 270 to have the fastest response, and therefore optimizes low power and lowers the overall complexity of the entire system.

The embodiment can achieve three goals simultaneously which are difficult or expensive to achieve when designing the system with outside reference biasing. The three characteristics are agile voltage bias generation, quick settling time to achieve target voltage, and the ability to go to low power mode and therefore turn off the subsystem 230 to save power for extended periods of time. These three characteristics result with the embodiment having very low power consumption. Other designs may try to achieve this by turning off the Bluetooth or wireless function entirely during times when it is not active, which would require an additional microcontroller to manage the measurements, ultimately impacting size and cost.

Figure 3A:
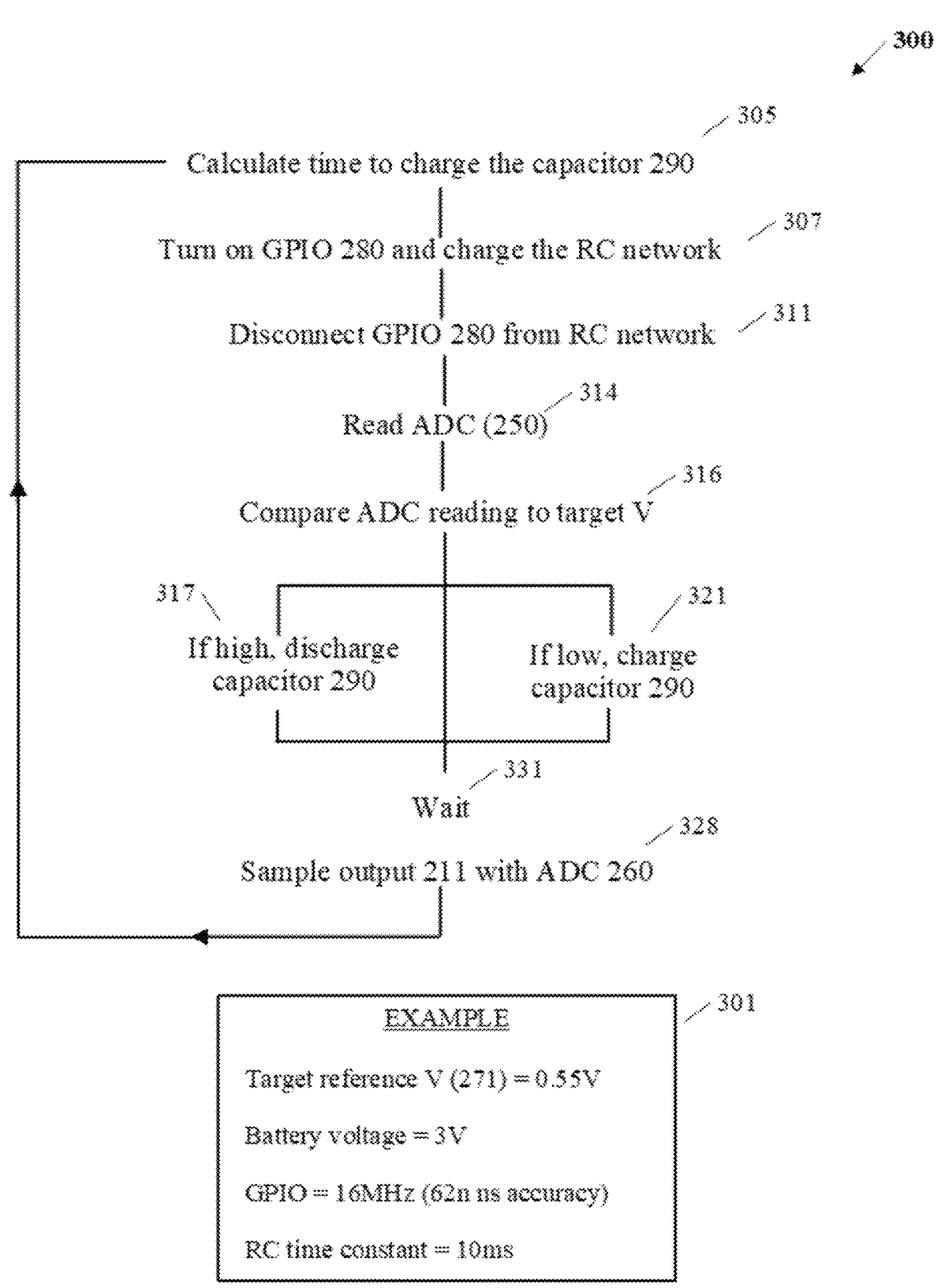
FIG. 3A is a flowchart of a process for controlling the new circuit design to generate a reference voltage using a single RC network as shown in FIG. 2A.

Referring now to FIG. 3A, a method 300 is illustrated for generating a highly accurate reference voltage signal, such as reference voltage 271. The method 300 operates with an SoC 230 that has a GPIO 280 generator and output port. As indicated in example box 301, this GPIO 280 has a clock speed of 16 megahertz, which enables a 62 ns time resolution. The GPIO 280 signal also will be output at a particular voltage, which is usually the voltage of the battery. As indicated in example box 301, the battery may have an initial voltage of 3V, however this voltage may change overtime, for example as the battery becomes older and voltages drop. The reference voltage 271 is set for 0.55V. The RC network is set to have a particular time constant, such as 10 ms. Using the battery voltage, which may be the initial voltage of 3V or an actual measured voltage, and the pulse rate of the GPIO 280, method 300 in step 305 calculates a precise elapse time to charge the capacitor 290 to achieve the target reference voltage 271. The GPIO 280 is then connected to the RC network and the capacitor charged for the calculated number of clock cycles As shown in block 307. The GPIO 280 is then turned off as the elapse time ends and is disconnected from the RC network, as shown in block 311.

The ADC 250 then takes a reading of the reference voltage 271 as shown in block 314. This measured voltage is then compared to the target voltage for the reference voltage as shown in block 316. If the measured voltage is high as shown in block 317, then the method 300 calculates a time to discharge capacitor 290. If the measured value is low as in shown in block 321, then the method 300 calculates a precise amount of time to add additional charge to capacitor 290. The discharge times and charge times can be calculated very accurately due to the 62 ns pulse resolution of the GPIO 280. It will be appreciated that other resolutions may be selected to achieve either higher or lower resolution needs. Once the target voltage has been adjusted in blocks 317 or 321, if needed, then the method 300 enters a wait period 331. Wait period 331 is set to meet the overall system sampling needs and to allow the voltage on the capacitor remain within spec for the duration of the waiting period. It will be understood that other wait times may be used according to application specific needs. Once the wait time has expired, then the system samples the output 211 of the op amp ADC 260. Sample time is the time slightly before the target measurement time. Target voltage is slightly above or slightly below the target voltage so that movement either discharging or charging will allow it to drift through the target voltage while sampling the output of the op amp. This effectively introduces noise to combat quantization noise and allows the samples to be taken over a longer period of time to minimize the effects of outside noise sources and their effects on the measurement. When the sample cycle has been completed, the system 300 then returns to recharge the RC network as shown in block 307. However, in many cases it would be advantageous to measure the actual battery voltage and recalculate the time to charge the capacitor 290 as shown in block 305 to achieve better overall accuracy.

Figure 3B:
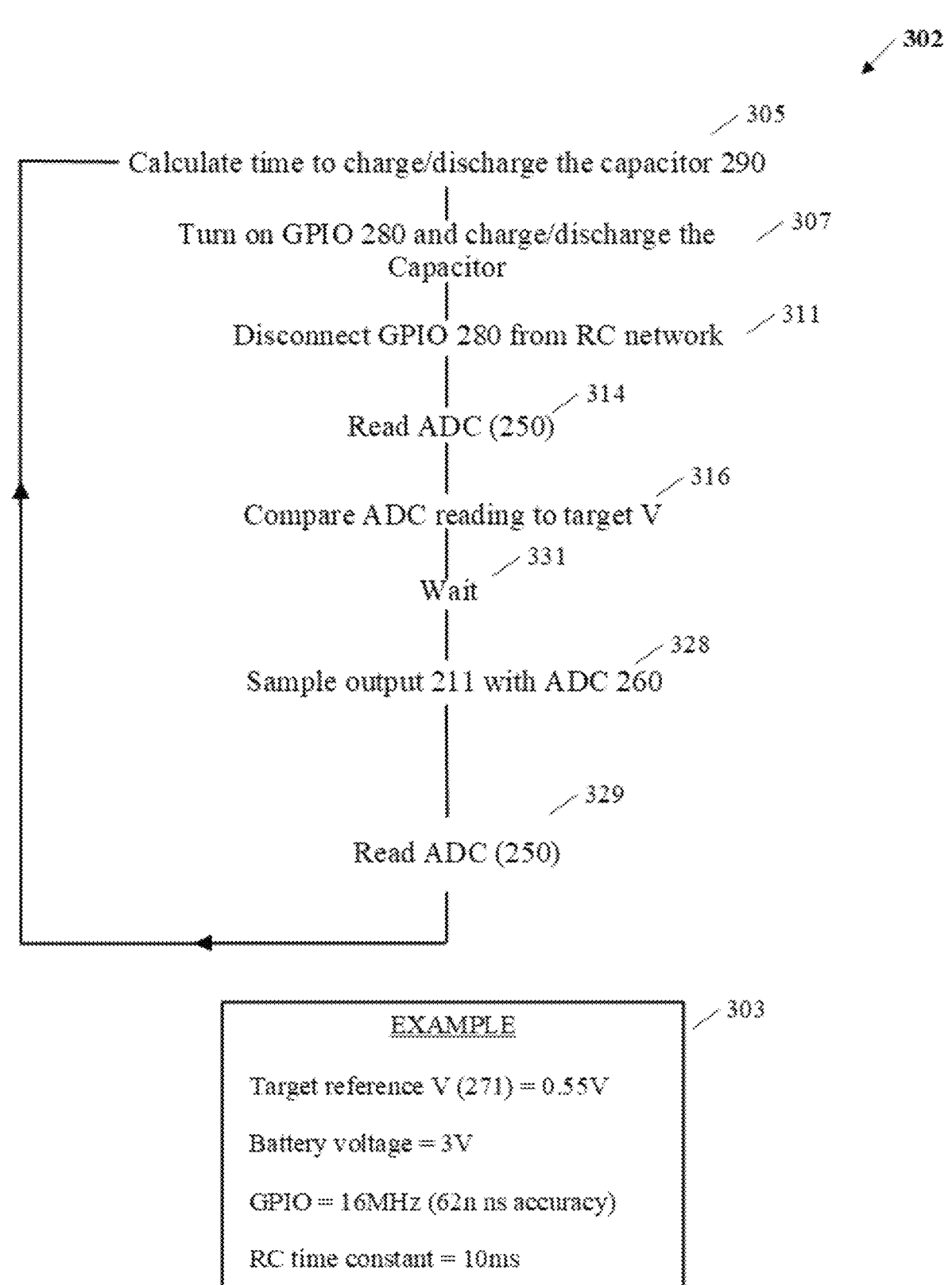
FIG. 3B is a flowchart of a process for controlling the new circuit design to generate a reference voltage using a single RC network as shown in FIG. 2A.

In an alternate embodiment, FIG. 3B demonstrates a simplified method for generating the highly accurate reference voltage. In 305 the time to charge or discharge the capacitor to the target voltage is calculated. 307 then starts the charging or discharging process to charge capacitor 290. In 311 after the charge/discharge cycle is complete, the GPIO 280 is disconnected from the RC to minimize leakage. 314 indicates the read the ADC 250 to measure the reference voltage after the charge/discharge is complete. 316 compares the reading of the reference to the target reference and records this internally. 331 indicates a wait where the circuit stabilizes and becomes read for the output sampling of 211. Next 328 starts the sampling sequence of 211 with ADC 260. At the conclusion of the sampling period, 329 is initiated to measure the reference with ADC 250 to measure the drift in the reference voltage during the settling and sampling periods. At this point the process can return to 305 and start the adjustment and measurement cycle again.

Referring again to FIG. 2B, another embodiment 201 of the new circuit is illustrated. This embodiment 201 is similar to the embodiment 200 described with reference to FIG. 2A, so only the differences will be discussed. Circuit 201 has a second GPIO generator 281 and output, which drives a second RC network. The second RC network has resistor 291 and capacitor 295

Figure 2B:
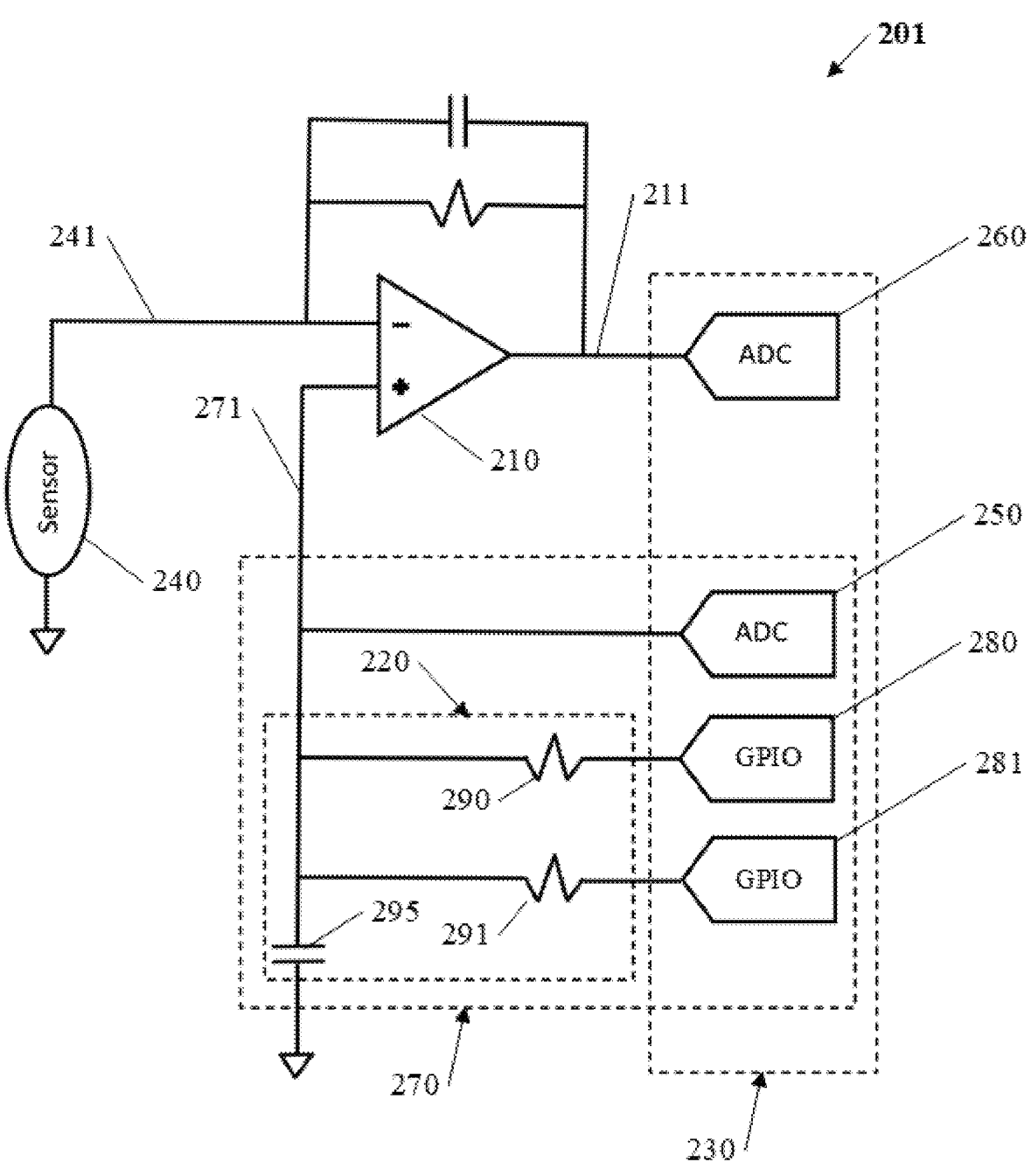
FIG. 2B illustrates an embodiment of the new circuit design with two resistor capacitor networks and an additional analog to digital converter, which together generate the reference voltage and drive noise signal required for the analogue to digital signal sampling.

Referring now to FIG. 4, a method 400 for generating a reference voltage is illustrated. Method 400 uses two RC networks as illustrated in FIG. 2B. It will be understood that three or more RC networks may be used for specific applications and to provide particular qualities for the reference voltage. In this example, it is desired to set the reference voltage 271 at 0.55 volts, as shown in example box 401. It will be understood that other operational amplifiers or other electrochemical sensors may require higher or lower voltages. GPIO 280 and GPIO 281 are both provided as 16 megahertz pulse generators, which gives a resolution of 62 ns. It will be understood that other pulse rates may be used, and at the pulse rates may be different between the two GPIO generators. The battery output is initially 3 volts. It will be understood that the battery voltage may be assumed to be 3 volts, and in other cases it may be desirable to measure the battery voltage in case there has been a drain on the battery and the battery voltage has dropped.

In block 405, method 400 calculates the elapse time to charge the capacitor 290 to achieve the target reference voltage on reference voltage line 271. This calculation of elapse time is based on the actual or measured battery voltage, the time constant of the first RC network (290/295), which here is 10 ms, and the pulse rate of the GPIO 280. With such a short time constant, the first RC network will be able to quickly bring the reference voltage 271 to its target voltage, which here is defined as 0.55V. As shown in block 408, the GPIO 280 is activated and the first RC network is charged or the calculated amount of time. As shown at block 411, as soon as the elapse time has ended, the GPIO 280 is deactivated and disconnected from the first RC network. As shown in bloc 416, a short wait time may be set to allow circuit voltage to fully settle, and the voltage on the reference line is measured.

In block 419, method 400 uses the measured value from on the reference line from 416 to calculate the elapse time to charge the capacitor 291 to achieve the target reference voltage on reference voltage line 271. This calculation is also based on the actual or measured battery voltage, the time constant of the second RC network (291/295), which here is 10 s, and the pulse rate of the GPIO 281. With such a long time constant, the second RC network will be able to efficiently reach and maintain reference voltage 271 to its target voltage. The advantage of using the two RC networks is two fold, it allows for a relatively lengthy delay from setting the RC2 and Vtarget being achieved with very high accuracy such that it can be then disabled for power savings as compared to the RC1 signal. RC1 is used as it quickly, without undue delay, gets the Vtarget close to the goal reference value. By using both RC1 and RC2 networks with different RC time constant values, the circuit can achieve optimally quick response time and achieve ideal accuracy with the lowest cost and lowest power.

In block 421, GPIO 281 is activated and charges the second RC network for the precise amount of elapse time calculated in block 419. Due to the high accuracy of the GPIO signal (62 ns) the amount of time for charging can be set so precisely that it is not necessary to re-measure the voltage on reference voltage line 271. As shown at block 426, as soon as the elapse time has ended, the GPIO 281 is deactivated and disconnected from the second RC network. As shown in bloc 429, a short wait time may be set to allow circuit voltage to fully settle. Method 400 may then proceed to sample 432 as described with reference to FIG. 3A After the sample has been taken, method 400 then may again set or maintain the reference voltage 271. As shown in block 433, method 400 may re-measure the battery voltage and the reference voltage line 271 and restart the process by calculating a new elapse time to charge the capacitor as shown in block 405.

Agile bias generation is useful to dynamically adjust to electrochemical variations over time and over the environmental variations or electrochemical cues which are typically encountered on a sensing device during the life of the sensor. These adjustments can be made during the device's operational time to a very fine level of precision based on both environmental measurements and electrochemical cues. Adjustments to the electrochemical and environmental variations are made through a software platform included with the embodiment, however initial calibration is made during manufacturing, releasing the user of the necessity of calibrating the device upon purchase.

In order to use an inexpensive low power SoC or micro-controller, it is necessary to use some advanced signal processing techniques to make the current measurement to digital conversion. Typically sensor measurement electronics, such as FIG. 1 use low cost SoC designs that are not high quality, nor high precision devices. High performance devices with ASICs, part of ASICs, or dedicated devices such as those with a voltage reference device 110, can negate the goal of low power, small size, and low cost. The use of a drift driving strategy, where the capacitor is charged to an initially higher than target value and slowly discharged through 1 LSB or more of range while sampling the desired signal, effectively introduces intentional noise and carefully controlled sampling to achieve a fundamentally higher accuracy data than a traditional ADC 130 sampling strategy.

Figure 5A:
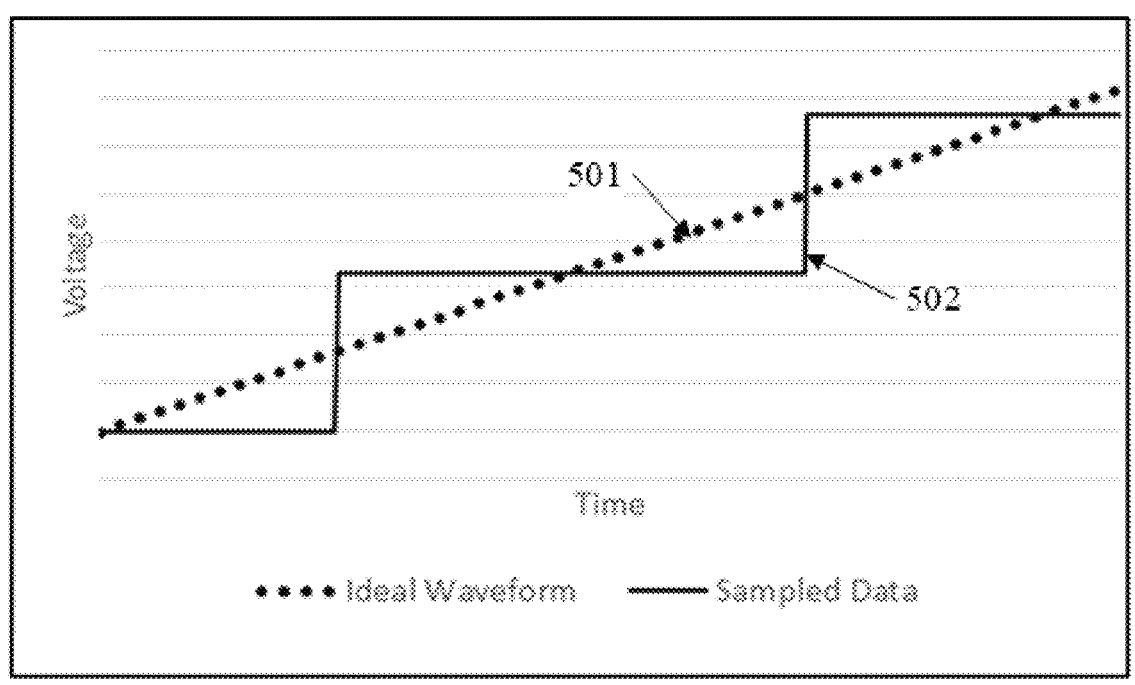
FIG. 5A illustrates a graph comparing the quantization error/noise introduced by the new circuit's sampling process compared to an ideal waveform that represents the ideal current input for the sensor.
Figure 5B:
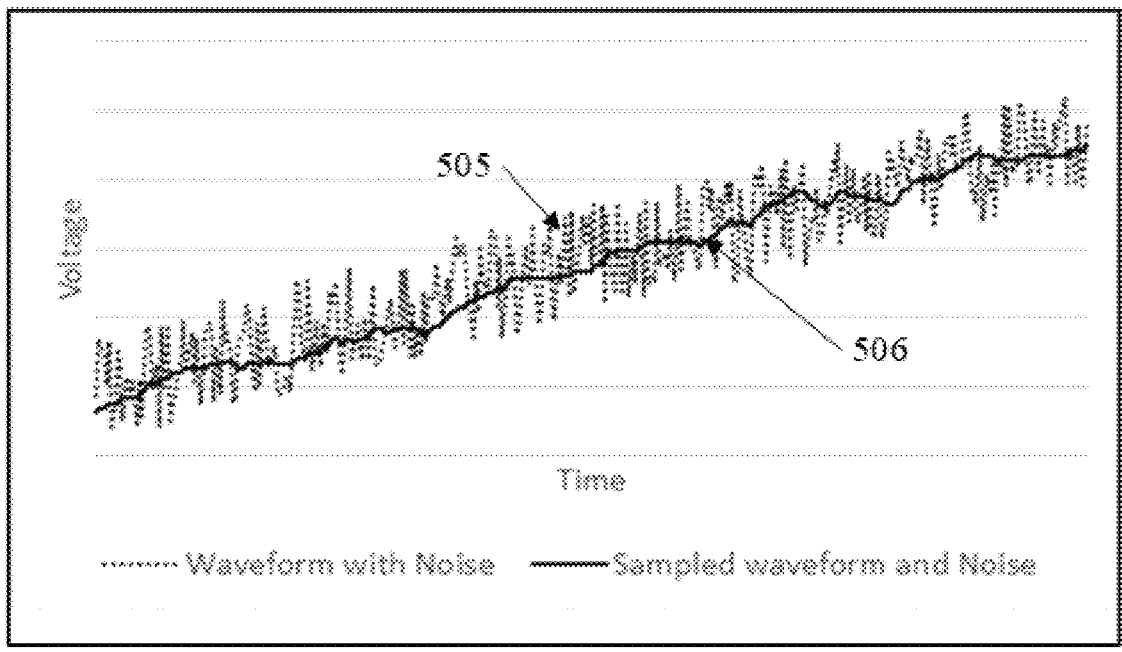
FIG. 5B illustrates a graph comparing a waveform of the measured signal with noise compared to the waveform of the enhanced ADC output with noise shaping and filtering.
Figure 5C:
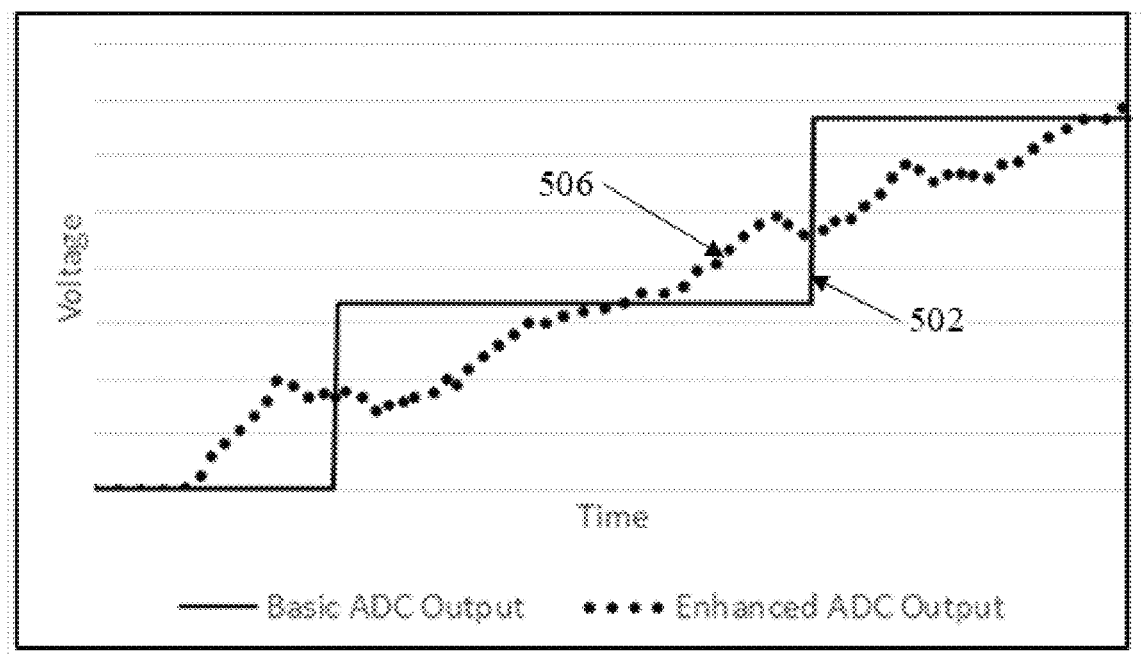
FIG. 5C illustrates a graph comparing the difference between the basic ADC sampled data with no noise shaping or filtering and the enhanced ADC output with noise shaping and filtering.

FIGS. 5A-C illustrate the improvement in accuracy by the intentional introduction of noise onto the noise drive line 271 and output sample line 211. FIG. 5A illustrates an output voltage 501 from an op amp that has almost no noise, such as would be present using known sensors. ADC measurements 502 show the measurement results from the ADC. As illustrated, the output 501 is rising nearly linearly, but due to quantization errors, the ADC will report "1" for a period time, the "2" for a period of time, and then "3" for a period of time. In this way, the accuracy of the measurement reported by the ADC is limited by the number of bits and quantization steps available. Accordingly, such a system would require a higher precision ADC.

Figure 6:
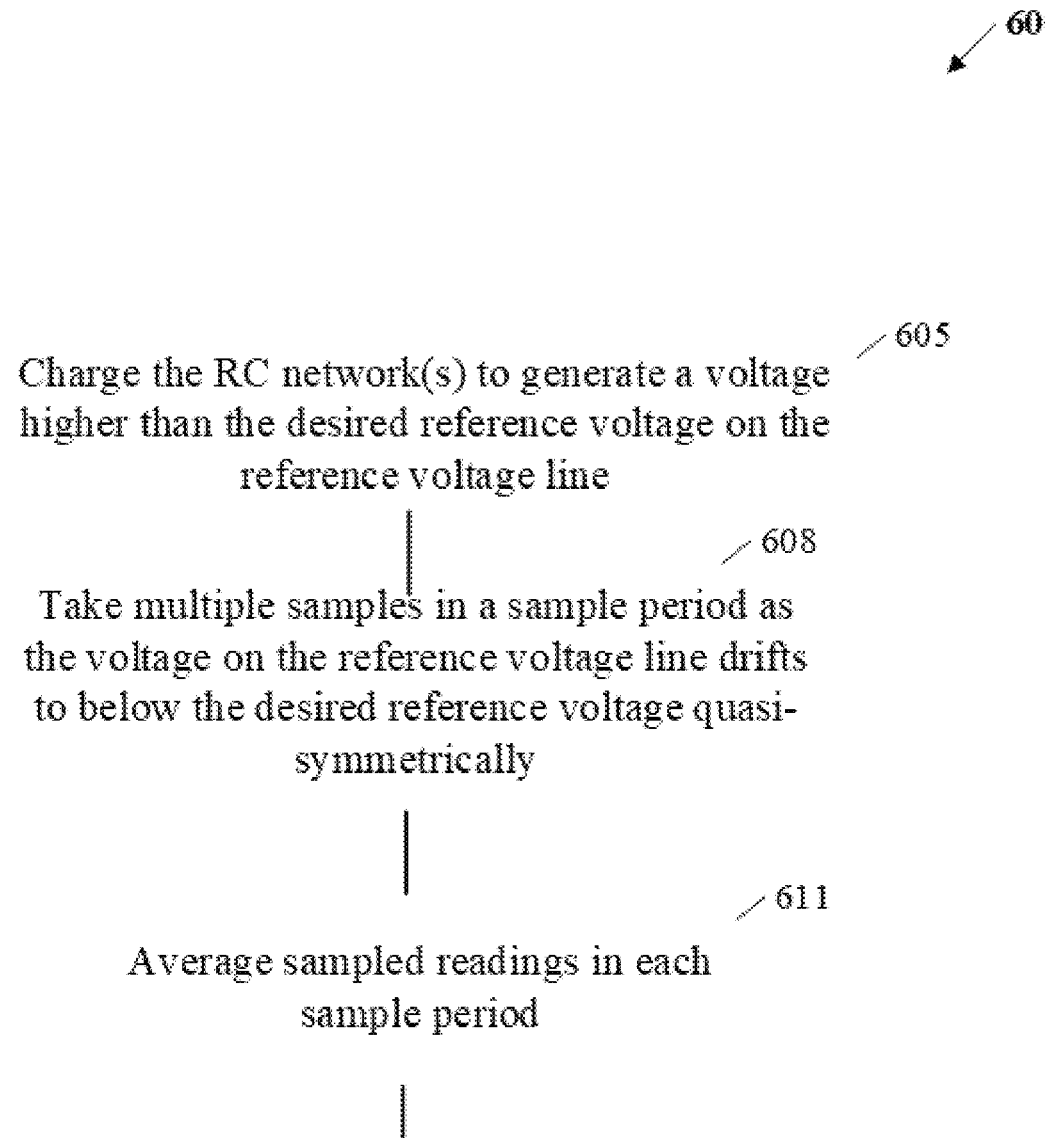
FIG. 6 is a flowchart of a process for measuring the output line for an opamp in accordance with the present invention.

In contrast, FIG. 5B shows the measurement results 505 of ADC 260 sampling the intentionally noisy output line 211. Due to the noise, the measurements appear far more erratic, depending on whether there is a positive or negative noise voltage on the output signal 211. These measurements are averaged, for example over some time period, and with the result being measurement 506. As summarized in FIG. 5C, when the output line from an op amp is rising linearly, if the output is relatively noise free, the ADC will report readings 502 with a huge quantization error. However, if the output line has intentional noise, and ADC readings are averaged, the results 506 will much more closely reflect the true output of the op amp. In this way, the addition of intentional noise enables the use of a lower cost and lower precision ADC, while giving better accuracy This scheme of generating noise and sampling seems simple, but it allows the noise inherent in the system to be spread over time and thus reduced. So overall averaging of a signal which is gaussian in nature will achieve a $1/\mathrm{sqrt}(n)$ reduction in noise. By adapting it to sample over a longer than necessary time allows short time transient effects in the system (such as muscle induced electrical noise, or outside electrical noise such has high frequency lamps or similar) can be reduced as it will have an effect over a small number of the samples and thus have a diminished effect on the overall reading. As illustrated in FIG. 6, this method 600 for improved measurement accuracy starts with waiting for the reference voltage 271 to settle as shown in block 605. While the average voltage of the target is achieved, there is a small level of residual noise included in the OPAMP+terminal. 608 of method 600 allows the sampling period to cover enough time to observe and benefit from the reference voltage drift and associated change in the output. In box 611, the sampled results are averaged and in 614 the results are stored in the database for later retrieval. Method 600 is a scenario where the capacitor is naturally losing charge and needing to be recharged periodically. In the case where the capacitor is accumulating charge this flow chart would be discharging the RC network(s).

FIGS. 5A-C illustrate the differences in waveforms of sampled data from a basic ADC output, enhanced ADC output, and the resulting sampled waveform with noise. The enhanced ADC output signal from FIG. 5C produces a waveform that is much closer to the ideal waveform, FIG. 5A, than the basic ADC output signal. By adding noise in a controlled manner as shown in FIG. 5B, highly accurate waveforms can be produced for introduction to the SoC.

Figure 5D:
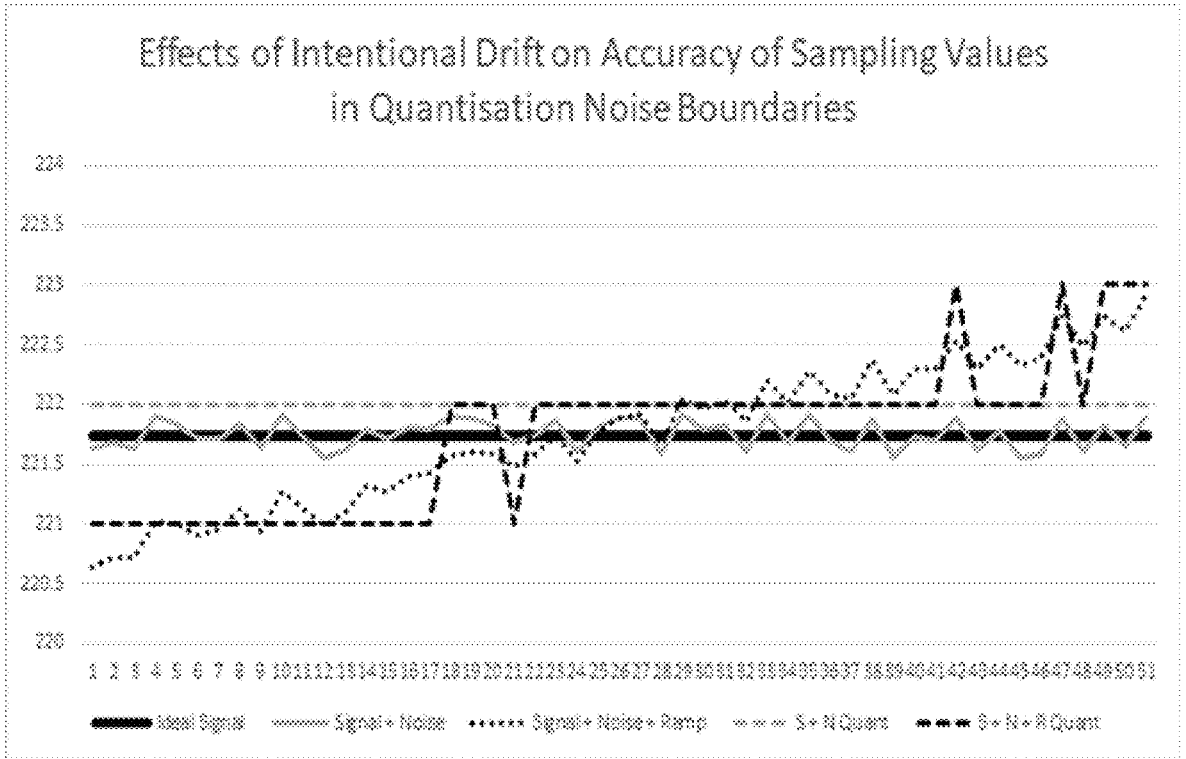
FIG. 5D illustrates a graph showing the effects of a drifting reference voltage.

In this embodiment, noise is intentionally introduced as a drifting reference voltage signal 271 in FIG. 2B. FIG. 5D demonstrates the effect in graph form. The ideal signal is the best expected result with an 8 bit sampling ADC. It shows the signal with conventional noise which is near the quantization noise level of the ADC. As such, the sampled results returns a non-ideal computed result of 222 when 221.74 is the desired result. When the same constrained ADC samples the signal with intentional noise added, the correct result is computed after the sampling interval, producing a result of 221.76. As such the sampling scheme with added intentional noise as in our system of adding intentional and calculated drift to the reference allows the quantization constrained system to produce more accurate results.

The removal of the outside bias reference 110 and replacing it with the subsystem of 270, as seen in FIG. 2A, a more accurate value is achieved at a much lower power consumption, lower cost and smaller size. The added subsystem 270 to the circuit allows the noise to be introduced onto the electrochemical sensor 240, and therefore the measurement to be at a rate which is not affected by the overall electrochemistry, while still allowing the sampling to be performed in a way to achieve a very accurate result, with approximately 17 bits of precision. By adding noise to the system which is larger than the quantization noise of the SoC ADC 260, the system can perform statistical calculations on the samples to achieve a higher precision result than could be achieved using direct SoC ADC 260 usage. As it is well known in the art that typical ADCs are limited to measuring integer values of voltage or current, the ADC 250 can be configured to measure the added noise to the system to develop a non-integer result. For example, instead of a measured value between 1 and 2, a value such as 1.7765 can be measured. The noise is introduced by applying the bias voltage to the sensor 240 by use of the direct capacitor charging system 270 coupled to an op amp 210 which is in turn coupled to the sensor 240.

To achieve long operational lifetime of the device, while maintaining high performance in the SoC 230, the overall average power consumption is reduced. Various embodiments can achieve this as a result of the bias voltage generation provided to the sensor produced by the added subsystem 270. The use of a direct capacitor charging system 270 to apply the bias voltage to the sensor 240 via a low power op amp 210, allows for the voltage generation to be halted and SoC 230 to be allowed to enter a low power state during periods between measurements. While these periods are not necessarily large, the effect can be great, as the key factor is the ratio between on and off time. By allowing the SoC 230 to be in extremely low power mode during portions of the operating time when a sample is not required, it allows the bias voltage to continue the electrochemical reaction while the SoC 230 is in low power mode thus optimizing the ratio of on to off time for the SoC 230. Since the SoC 230 operation is the dominant source of power consumption in the system, it is clear that it must be well managed. By using a high quality op amp 210, which has a low bias current and characteristically high input impedance, the system can maintain a very accurate bias voltage while in low power mode by using the capacitors in the RC network 220 coupled to the direct capacitor charging system 270. This allows the direct capacitor charging system 270 to be turned off for long periods of time which allows the system to measure the electrochemical values periodically with high accuracy.

Referring now to FIG. 7, a component block diagram 700 of the SoC 230 is illustrated. SoC 230 has a processor 705 that may be a microcontroller, FPGA, or other type of general purpose or specific computer processor. The computer processor 705 connects to a highly accurate timer 711. The CPU further has capture or measurement software 271 that cooperates with compare algorithms or firmware for making measurements from the GPIO 731 bus. In this way, CPU 705 may not only set 733 the configuration for the GPIO output 731, but it is also able to capture levels from the GPIO 731 to assure targets are met and maintained. GPIO 731 is a pulse generator typically operating at the voltage of the battery. Here, the battery is expected to be 3 volts, however that may change depending upon application specifics, and age and usage of the battery. The GPIO 731 may also be, for example, a 16 MHz pulse generator, although it will be understood that many other pulse rates may be used. The GPIO 731 connects to output pins, such as output pins 741 and 742. SoC 230 is constructed such that the pins, such as pins 741 and 742, may be fully disconnected from follow on circuitry, thereby isolating The CPU for capacitive effects.

What is claimed is:

1. A circuit for measuring an output signal from an electronic sensor, comprising:
   a measurement output line from the electronic sensor coupled to a first input of an op amp;
   a reference signal line coupled to a second input to the op amp;
   a reference signal generator coupled to the reference signal line, the reference signal generator further comprising:
      a first GPIO pulse generator coupled to a first a first RC network;
      a reference ADC coupled to the reference signal line;
   a sampling ADC sampling an output of the op amp; and
   a processor constructed to activate the GPIO for a precise elapse time such that the first GPIO pulse signal charges the capacitor to about a target reference voltage.

2. The circuit according to claim 1, wherein the processor, the GPIO pulse generator, the reference ADC and the sampling ADC are all in a same SoC.

3. The circuit according to claim 1, wherein the measurement output line is from a biological sensor, and the measurement output line is a current measurement that the op amp converts to a voltage output on the op amp output.

4. The circuit according to claim 1, wherein the first RC network comprises a first resistor and a capacitor.

5. The circuit according to claim 1, wherein the first RC network comprises an output pin from the GPIO and a capacitor, the outpin configured as a current source or as a current sink.

6. The circuit according to claim 1, wherein the first RC network comprises an output pin from the GPIO and a resistor and a capacitor, the output pin configured as a voltage source.

7. The circuit according to claim 1, wherein the reference signal generator further comprises:
   a second GPIO pulse generator coupled to a second RC network, the second RC network having a longer time constant as compared to the first RC network; and
   wherein the processor is constructed to activate the second GPIO for a precise elapse time such that the second GPIO pulse signal charges the capacitor to about a target reference voltage.

8. The circuit according to claim 7, wherein the first RC network comprises an output pin from the GPIO and a capacitor, the outpin configured as a current source or as a current sink.

9. A method of generating a reference voltage for an op amp that is coupled to an output of an electronic sensor, comprising:
   calculating an elapse time for a GPIO clock output to charge an RC network to about a target reference voltage;
   activating the GPIO for the elapse time to charge the RC network;
   measuring an output voltage from the RC network;
   comparing the measured output voltage to the target reference voltage;
   if the measure voltage is too high, then discharging the RC network for a short elapse time;
   if the measure voltage is too low, then charging the RC network for a short elapse time; and
   waiting a period of time and using an ADC to sample an output from the op amp over a sample period.

10. The method according to claim 9, wherein the calculating step includes measuring an input battery voltage and using the measured battery voltage in calculating the elapse time.

11. The method according to claim 9, wherein the target reference is allowed to drift from an initial voltage to a lower voltage or a higher over the sample period.

12. The method according to claim 11, wherein multiple samples are taken in the sample period and averaged to reduce quantization error effects.

13. The method according to claim 9, wherein multiple samples are taken in the sample period to improve accuracy.

14. A method of generating a reference voltage on a reference voltage line for an op amp that is coupled to an output of an electronic sensor, comprising:
   calculating a first elapse time for a first GPIO clock output to charge a first RC network to about a target reference voltage;
   activating the first GPIO for the first elapse time to charge the first RC network, which is coupled to the reference voltage line;
   waiting a period of time and measuring the voltage on the reference voltage line;
   calculating, using the voltage measured on the reference voltage line, a second elapse time for a second GPIO clock output to charge a second RC network to about a the target reference voltage;
   activating the second GPIO for the second elapse time to charge the second RC network, which is coupled to the reference voltage line; and
   waiting a period of time and using an ADC to sample an output from the op amp over a sample period.

15. The method according to claim 14, further including the steps of:

after sampling the output of the op amp, measuring the voltage reference line and using this measurement to calculate a third elapse time for the first GPIO clock output to charge the first RC network to about the target reference voltage.

16. The method according to claim 14, wherein the first or second calculating steps includes measuring an input battery voltage and using the measured battery voltage in calculating the first or second elapse times.

17. The method according to claim 14, wherein the target reference is allowed to drift from an initial voltage to a lower voltage or a higher voltage over the sample period.

18. The method according to claim 17, wherein multiple samples are taken in the sample period and averaged to reduce quantization error effects.

19. The method according to claim 14, wherein multiple samples are taken in the sample period to improve accuracy.

* * * * *